(12) United States Patent
    Kurtz

(10) Patent No.: US 9,310,593 B2
(45) Date of Patent: Apr. 12, 2016

(54) HOLOGRAPHIC SOLAR COUPLER

(75) Inventor: Russell M. Kurtz, Palos Verdes Estates, CA (US)

(73) Assignee: Luminit LLC, Torrance, CA (US)

( * ) Notice: Subject to any disclaimer, the term of this patent is extended or adjusted under 35 U.S.C. 154(b) by 24 days.

(21) Appl. No.: 13/448,843

(22) Filed: Apr. 17, 2012

(65) Prior Publication Data
    US 2012/0262769 A1    Oct. 18, 2012

Related U.S. Application Data

(60) Provisional application No. 61/476,388, filed on Apr. 18, 2011.

(51) Int. Cl.
    *G02B 5/32*     (2006.01)
    *G03H 1/00*     (2006.01)
    *G02B 19/00*    (2006.01)
    *F24J 2/06*     (2006.01)
    *H01L 31/054*   (2014.01)

(52) U.S. Cl.
    CPC ............. *G02B 19/0028* (2013.01); *F24J 2/06* (2013.01); *G02B 5/32* (2013.01); *G02B 19/0042* (2013.01); *H01L 31/0543* (2014.12); *H01L 31/0547* (2014.12); *Y02E 10/44* (2013.01); *Y02E 10/52* (2013.01)

(58) Field of Classification Search
    CPC ............ G02B 5/32; G02B 6/04; G02B 6/105; G02B 6/02; G02B 6/02042; G02B 6/4204; G02B 27/0037; G02B 19/0042; G03H 1/0005; G03H 2001/0005; H01L 31/0543; H01L 31/0547; F24J 2/06; Y02E 10/44; Y02E 10/52
    USPC .................................................... 359/15, 34
    See application file for complete search history.

(56) References Cited

U.S. PATENT DOCUMENTS

| | | | |
|---|---|---|---|
| 5,517,339 A | 5/1996 | Riccobono et al. | |
| 6,243,515 B1 | 6/2001 | Heflinger et al. | |
| 6,282,341 B1 * | 8/2001 | Digonnet et al. | 385/37 |
| 7,315,671 B2 * | 1/2008 | Huck et al. | 385/18 |
| 7,469,082 B1 | 12/2008 | Okorogu | |
| 2007/0246040 A1 | 10/2007 | Schaafsma | |

(Continued)

OTHER PUBLICATIONS

J. H. Karp, E. J. Tremblay, and J. E. Ford, "Planar Micro-Optic Solar Concentrator," *Opt. Exp.* 18, 1122-1133 (2010).

(Continued)

*Primary Examiner* — Jade R Chwasz
(74) *Attorney, Agent, or Firm* — Husch Blackwell LLP

(57) ABSTRACT

A method and system of collecting radiation with an array of lenses or a diffractive optical element are disclosed, the method includes: modifying angles of convergence and/or divergence, and a direction of propagation, with a diffractive element, and coupling the radiation into optical fibers, without separating the radiation into separate bands. The system includes an array of lenses or a diffractive optical element; a broadband holographic optical element, and at least one optical fiber, wherein the array of lenses or the diffractive optical element is configured to collect light and direct the light to the broadband holographic optical element, and wherein the broadband holographic optical element is configured to partially collimate and/or redirect light into the at least one optical fiber, and wherein the at least one optical fiber is configured to transmit the radiation away from the array of lenses or the diffractive optical element.

15 Claims, 2 Drawing Sheets

(56) References Cited

U.S. PATENT DOCUMENTS

2010/0186818 A1    7/2010  Okorogu et al.
2010/0278480 A1*  11/2010  Vasylyev .................. 385/33
2010/0329619 A1*  12/2010  Moore ............... H01L 31/0547
                                                 385/129

OTHER PUBLICATIONS

G. Rosenberg, R. K. Kostuk, and M. Zecchino, "Holographic Planar Concentrator Increases Solar-Panel Efficiency," *Laser Focus World* 44, (2008).

* cited by examiner

HOLOGRAPHIC SOLAR COUPLER

CROSS REFERENCE TO RELATED APPLICATIONS

This application claims priority to U.S. Provisional Patent Application No. 61/476,388, filed on Apr. 18, 2011, which is incorporated herein by reference in its entirety.

FIELD OF THE INVENTION

This invention relates to collecting broadband optical radiation and injecting it into an optical fiber or waveguide, from the side of said fiber or waveguide, and more particularly, wherein the injection relates to concentrating solar radiation into the fiber or waveguide for its use as a solar concentrator.

BACKGROUND

Photovoltaic solar cells can be improved through the use of concentrators, which collect sunlight in a large area and present it in a much smaller area. This can both increase the efficiency of the solar cells and reduce the required area of the cells.

The simplest solar concentrator is a focusing lens or mirror, which increases the light intensity on the solar cell. Traditional optics limits the distance from the focusing lens or mirror to the focal spot to be no less than approximately the characteristic dimension of the focusing element (for example, the diameter of a lens with circular aperture). Large concentration, then, results in a large concentrator using traditional optics.

Accordingly, there is a need for optical concentrators that are thinner (smaller in the direction perpendicular to the concentrator surface) and lighter than permitted by traditional optics.

SUMMARY

In accordance with a preferred implementation, the system comprises: an array of lenses (or lenslets) focusing solar radiation to a point; a broadband transmission holographic optical element to partially collimate and/or redirect the radiation; a broadband reflection holographic optical element to partially collimate and or redirect the radiation; and an optical fiber to transmit the radiation away from the lens array.

In accordance with an exemplary embodiment, the broadband holographic optical element is a transmission holographic optical element and/or a reflection holographic optical element. In addition, multiple layers or a plurality of holographic optical elements can be used. In accordance with an embodiment, the holographic optical elements operate at different wavelengths.

In accordance with another exemplary embodiment, the optical fiber is a plurality of optical fibers. The optical fiber is composed of a core, a cladding, and an optional transparent sheath. Alternatively, the optical fiber is composed of bare core. In accordance with an exemplary embodiment, the optical fiber is an optical waveguide. The optical fiber is preferably a graded-index fiber or a step-index fiber. The optical fibers are preferably bundled at the output. In addition, the optical fibers can be embedded in a medium. For example, the medium in which the fibers are embedded can be used as a cooling system.

In accordance with an exemplary embodiment, the array of lenses is monolithic. Alternatively, the array of lenses consists of independent lenses. The array of lenses can have spherical surfaces, aspherical surfaces, and/or can be flat. In accordance with an exemplary embodiment, the lenses are Fresnel lenses. In accordance with another exemplary embodiment, the array of lenses is holographic or diffractive optical elements.

Because the lens array consists of a plurality of individual lenses with short focal length, the distance to maximum concentration is much shorter than when an individual focusing lens or mirror of the same size as the lens array is used. The invention, then, is much thinner than a solar concentrator using traditional optics and having the same level of concentration.

In order for the focused radiation to be captured by the optical fiber, the set of rays representing this radiation must fall within the angle defined by the limiting numerical aperture of the fiber:

$$NA = n_{core} \sin \theta,$$

where $n_{core}$ is the refractive index of the fiber core and $\theta$ is half the maximum cone angle of the rays. For a fiber whose cladding refractive index is $n_{clad}$, the limiting numerical aperture is $$NA_{max} = \sqrt{n_{core}^2 - n_{clad}^2}.$$

Note that the holographic optical elements are assumed to have significant spectral bandwidth.

In accordance with another exemplary embodiment, a method of focusing radiation with an array of lenses, comprises: modifying the angles of propagation and convergence/divergence with transmission and reflection holographic optical elements; and coupling it into an optical fiber.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
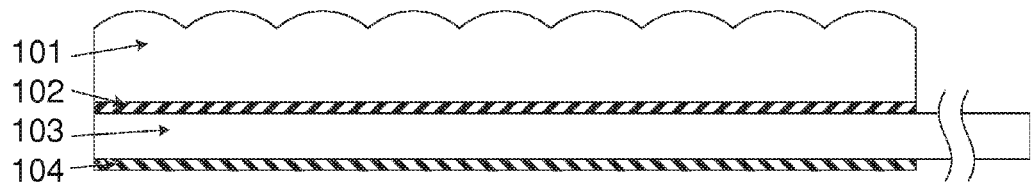
FIG. 1 shows a side view of the preferred implementation.

Reference will now be made in detail to the present preferred embodiments of the invention, examples of which are illustrated in the accompanying drawings. Wherever possible, the same reference numbers are used in the drawings and the description to refer to the same or like parts.

FIG. 1 shows a side view of the preferred implementation of a system for collecting broadband optical radiation and injecting it into an optical fiber or waveguide. Layer 101 is an optical lens array, layer 102 is a broadband transmission holographic optical element, layer 103 is an optical fiber, and layer 104 is a broadband reflection holographic optical element. As shown in FIG. 1, the optical fiber 103 may extend outward (i.e., a long way out) from the lens array.

Figure 2:
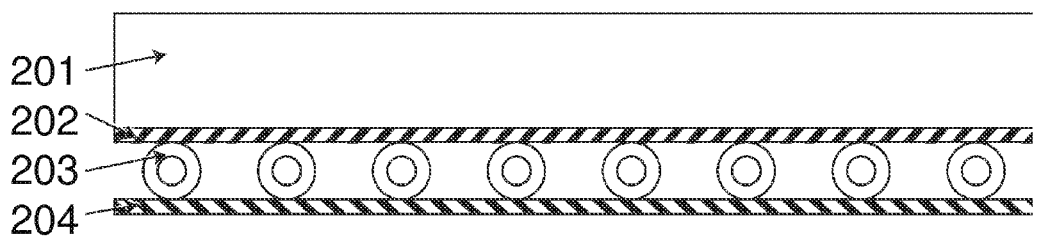
FIG. 2 shows a front view of the preferred implementation.

FIG. 2 shows a front view of the preferred implementation. The same four layers are identified as in FIG. 1: layer 201 is the optical lens array, 202 is the transmission holographic optical element, 203 is the optical fiber (drawn in this Figure as including just a core and cladding), and 204 is the reflection holographic optical element.

Figure 3:
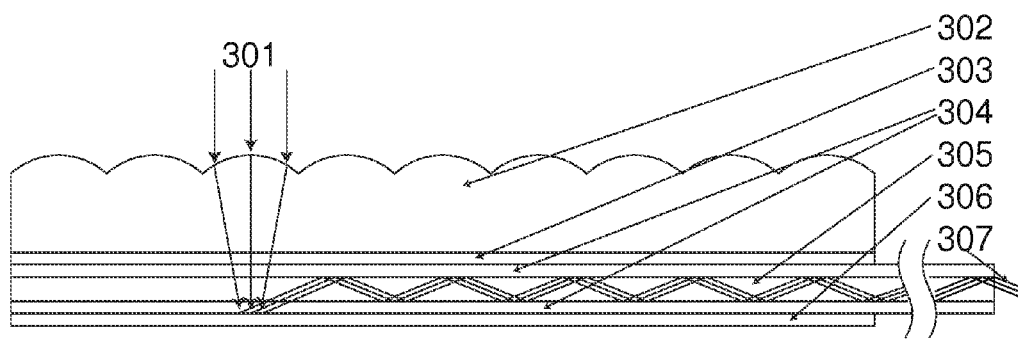
FIG. 3 shows the general operation of the invention.

FIG. 3 shows the general operation of the invention. Solar radiation 301 is focused by each individual lens (only one is shown in use) within the lens array 302. This radiation is adjusted by the transmission holographic optical element 303, passes through the optical fiber cladding 304 and core 305, and is adjusted again by the reflection holographic optical element 306. The radiation is then conditioned such that it enters the core of the optical fiber 305 completely within the limiting numerical aperture of the fiber. The radiation then transmits through the fiber to leave the end 307.

Figure 4:
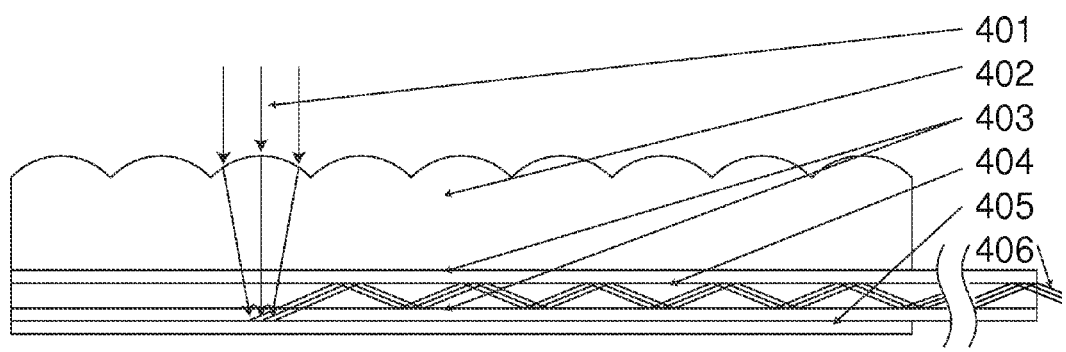
FIG. 4 shows operation of the invention using only the reflection holographic optical element.

FIG. 4 shows operation of the invention using only the reflection holographic optical element. Solar radiation 401 is focused by each individual lens (only one is shown in use) within the lens array 402. This radiation passes through the optical fiber cladding 403 and core 404, and is adjusted by the reflection holographic optical element 405. The radiation is then conditioned such that it enters the core of the optical fiber 404 completely within the limiting numerical aperture of the fiber. It then transmits through the fiber to leave the end 406.

Figure 5:
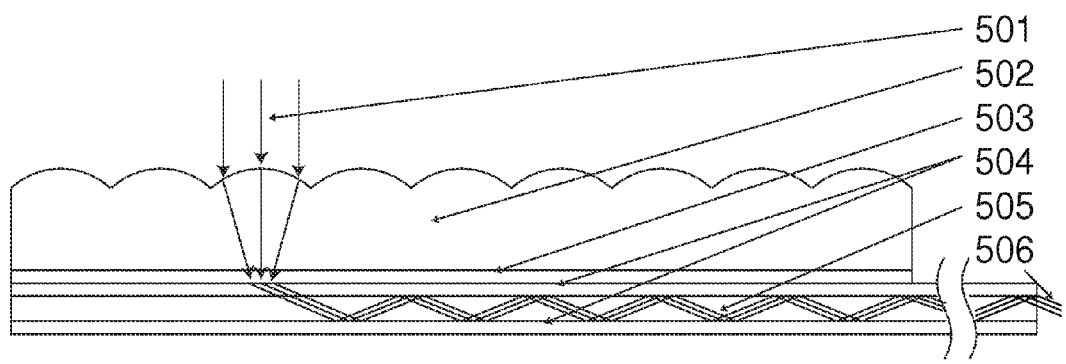
FIG. 5 shows operation of the invention using only the transmission holographic optical element.

FIG. 5 shows operation of the invention using only the transmission holographic optical element. Solar radiation 501 is focused by each individual lens (only one is shown in use) within the lens array 502. This radiation is adjusted by the transmission holographic optical element 503, and then passes through the optical fiber cladding 504 and core 505. The radiation is then conditioned such that it enters the core of the optical fiber 505 completely within the limiting numerical aperture of the fiber. It then transmits through the fiber to leave the end 506, which may be part of a fiber bundle.

In the ideal implementation, the invention is embodied in four sections: (1) a preformed, monolithic lenslet array to focus and concentrate the incoming solar radiation; (2) a broadband transmission holographic optical element, which partially recollimates and redirects the focused radiation; (3) a broadband reflective optical element, which also partially recollimates and redirects the focused radiation (which may have been recollimated and redirected by the transmission holographic optical element); and (4) a number of optical fibers, which take this recollimated and redirected radiation and deliver it to the location at which it is needed.

As an example of how this could work in an exemplary implementation, the lenslet array could be aimed towards the sun. An array covering an area of 1 m$^2$ on the surface of the Earth would then receive approximately 1,000 W of solar radiation (this is described in optical terms as insolation of 1,000 W/m$^2$). The array of lenslets can have average spacing of 5 mm, in which case there would be 40,000 such lenslets in an array 200 lenslets on a side. If the optical fibers are laid out as shown in FIG. 2, with one fiber per row of lenslets, the 1,000 W collected by the lenslet array could be coupled into 200 optical fibers. If the core of each fiber is 0.25 mm diameter, the total area of the fiber output is then about 10 mm$^2$. The concentration factor of this invention, then, could be as large as 10$^5$, or 100,000 times. In that case, the output irradiance would be 10$^8$ W/m$^2$, or in more commonly used units 10 kW/cm$^2$; this is generally far below the optical damage threshold of the fibers. It can be appreciated, that in accordance with an exemplary embodiment, the losses in this paragraph are ignored, which results in extraordinarily optimistic values.

The method of operation of this invention is shown in FIG. 3. Solar radiation is focused by the lens array. These lenses may be individual or monolithically formed with a single substrate. Since each lens is much smaller than the total array, the focal length can also be small (for example, with lenslets spaced at 5 mm, the focal length can be 5 mm, compared to the 1,400 mm focal length of a 1 m square lens).

Without further optics, the radiation would be brought to a focus, then diverge at the same rate as it had converged. For the low focal ratios (focal length divided by lens diameter) which are expected to be used, the full angle of the cone containing the rays being focused is around 90° (the angle of rays is ±45° with respect to the optical centerline. There are two important points about this: (1) the numerical aperture (in air) of this propagating pattern is 0.71, well beyond the typical limiting numerical aperture of an optical fiber; and (2) the direction of propagation (the optical centerline) is perpendicular to the centerline of the optical fiber. Thus, the cone of radiation must be partially recollimated and partially redirected, so that it lies within the acceptance angle of the optical fiber.

The holographic optical elements perform this task. As more fully set forth and described in the Claims, there may be one or two such elements, and wherein each element may be a single layer or multiple layers. A single element can achieve both recollimation and redirection. It can be appreciated that there are reasons, however, to use multiple elements and/or multiple layers as set forth herein.

For example, one reason to use multiple elements is that holographic optical elements usually have a tradeoff between angular acceptance and wavelength acceptance. Thus, a broadband element would work better as a collimator or a beam director, rather than both. Alternatively, the transmission element can be a collimator with a small amount of beam direction, and the reflection element can be a beam director with only a small amount of recollimation.

The second reason to use multiple elements or layers is the broadband nature of solar radiation. Since it can be difficult to make the holographic optical element work at high efficiency over a large bandwidth, in accordance with an embodiment, it may be necessary to have three or four layers of such elements, or have the transmission element work in one wavelength range and the reflection element work in another wavelength range.

It will be understood that the foregoing description is of the preferred embodiments, and is, therefore, merely representative of the article and methods of manufacturing the same. It can be appreciated that many variations and modifications of the different embodiments in light of the above teachings will be readily apparent to those skilled in the art. Accordingly, the exemplary embodiments, as well as alternative embodiments, may be made without departing from the spirit and scope of the articles and methods as set forth in the attached claims.

What is claimed is:

1. A method of collecting broadband radiation with a solar coupler having an array of lenses, the method comprising:
   first focusing the broadband radiation by each lens of the array of lenses substantially to a point;
   then adjusting the broadband radiation with a transmission holographic optical element which partially collimates and redirects the broadband radiation;
   adjusting the broadband radiation with a reflection holographic optical element which partially collimates and redirects the radiation;

conditioning the broadband radiation so that the broadband radiation enters into a core of an optical fiber, without separating the broadband radiation into separate bands; and directing the broadband radiation through the optical fibers within the core for delivery of the broadband radiation to a location spaced from the solar coupler.

2. A system for collecting broadband radiation, the system comprising:

an array of lenses or a diffractive optical element;
a transmission holographic optical element;
a reflection holographic optical element, and
at least one optical fiber having a core and a cladding,
wherein each lens of the array of lenses focuses solar light substantially to a point and directs the light to the transmission holographic optical element, and wherein the transmission holographic optical element partially collimates and/or redirect the solar light to the reflection holographic optical element which adjusts the solar light, partially collimates and directs it through the cladding into the core of at least one optical fiber and to travel within the core, and wherein the at least one optical fiber is configured to transmit the solar light within the core away from the system to a remote location.

3. The system of claim 2, wherein multiple layers of holographic optical elements are used.

4. The system of claim 2, wherein the at least one optical fiber comprises a plurality of optical fibers.

5. The system of claim 4, wherein the plurality of optical fibers are bundled at the output.

6. The system of claim 4, wherein the plurality of optical fibers are embedded in a medium.

7. The system of claim 6, wherein the medium in which the fibers are embedded is used as a cooling system.

8. The system of claim 2, wherein the at least one optical fiber is composed of a core, a cladding, and a transparent sheath.

9. The system of claim 2, wherein the at least one optical fiber is composed of a core and a cladding.

10. The system of claim 2, wherein the at least one optical fiber is composed of bare core.

11. The system of claim 2, wherein the array of lenses is monolithic or consists of independent lenses.

12. The system of claim 2, wherein the array of lenses have spherical surfaces or aspherical surfaces.

13. The system of claim 2, wherein the array of lenses are flat.

14. The system of claim 2, wherein the array of lenses are Fresnel lenses.

15. The system of claim 2, wherein the at least one optical fiber is a graded-index fiber or a step-index fiber.

* * * * *